(12) United States Patent
Zu et al.

(10) Patent No.: US 8,247,909 B2
(45) Date of Patent: Aug. 21, 2012

(54) SEMICONDUCTOR PACKAGE DEVICE WITH CAVITY STRUCTURE AND THE PACKAGING METHOD THEREOF

(75) Inventors: Longqiang Zu, Palo Alto, CA (US); Yu-Yu Lin, Hsinchu (TW)

(73) Assignee: Global Unichip Corporation, Hsinchu (TW)

( * ) Notice: Subject to any disclaimer, the term of this patent is extended or adjusted under 35 U.S.C. 154(b) by 44 days.

(21) Appl. No.: 12/929,549

(22) Filed: Feb. 1, 2011

(65) Prior Publication Data
US 2012/0146218 A1 Jun. 14, 2012

(30) Foreign Application Priority Data
Dec. 9, 2010 (TW) .............................. 99142957 A

(51) Int. Cl.
*H01L 23/48* (2006.01)
*H01L 29/40* (2006.01)
(52) U.S. Cl. ........ 257/777; 257/621; 257/787; 438/106; 438/109; 438/112
(58) Field of Classification Search .................. 257/777, 257/787, 738, 621, E21.499, E23.021; 438/106, 438/109, 112, 127
See application file for complete search history.

(56) References Cited

U.S. PATENT DOCUMENTS
6,133,637 A * 10/2000 Hikita et al. .................. 257/777
2004/0070083 A1 * 4/2004 Su ................................. 257/778
* cited by examiner Primary Examiner — Theresa T Doan
(74) Attorney, Agent, or Firm — Bacon & Thomas, PLLC

(57) ABSTRACT

A semiconductor device with a cavity structure comprises: a carrier substrate; a first die having an active surface and the pads thereon; a back surface of the first die is disposed on the carrier substrate; a second die having a top surface and a back surface and a cavity structure therein; the top surface of a second die is flipped to dispose on the first die, and the cavity structure is an inverse U-type to dispose between the active surface of the first die and the top surface of the second die; the wires is electrically connected the pads with the first connecting points; a package body encapsulated the first die, the second die, the wires, and the portion of the top surface of the carrier substrate; and the connecting components is disposed on the back surface of the carrier substrate and is electrically connected the second connecting points.

18 Claims, 2 Drawing Sheets

SEMICONDUCTOR PACKAGE DEVICE WITH CAVITY STRUCTURE AND THE PACKAGING METHOD THEREOF

BACKGROUND OF THE INVENTION

1. Field of the Invention

The present invention related to a semiconductor package device, and more particularly to a semiconductor package device with a cavity structure therein.

2. Description of the Prior Art

Please refer to FIG. 1, shows a cross-sectional view of conventional ball grid array (BGA) package device. The BGA package device 100 includes semiconductor die 120 which is disposed on substrate 110 or carrier substrate 110, and is electrically connected carrier substrate 110 via the plurality of conductive wires 130. A plurality of connecting components 150 is disposed on the top surface of carrier substrate 110.

Unfortunately, in the conventional package technology, package material 140 such as epoxy resin with higher dielectric constant (the dielectric constant k is over 2) will interfere the millimeter wave that is generated from the package device when the epoxy resin is contacted directly with the package device with high sensitive such as Applicant-specific integrated circuit (ASIC) device. The epoxy resin with high dielectric constant will change the signal wave-conduction speed, and the signal decay is to be occurred during the wave-conduction. When the wave is conducted to pass through different materials, the wave-conduction speed would be different between the different materials with different dielectric constants, so as to the signal distortion would be generated. The selection for the material 140 of package body must be avoided by using the high dielectric constant material to prevent the signal distortion. However, the plurality of conductive wires is formed by wire bonding process within the package structure which needs the epoxy molding compound to protect the plurality of conductive wires, in which the dielectric constant of the epoxy molding compound is usually larger than 4, so that the signal distortion would be existed.

SUMMARY OF THE INVENTION

According to the problems of the conventional prior art, the present invention mainly provides a cavity structure which is disposed within the package device away from the high sensitive integrated circuit.

Another objective of the present invention is to provide a cavity structure as an induced device to isolate the package body or other organic materials from the high sensitive integrated circuit to prevent the decay of the signal conduction.

According to above objectives, the present invention provides a method for packaging a semiconductor package device with a cavity structure therein, which includes: providing a first die having an active surface and a back surface, and a plurality of pads is disposed on the active surface; providing a carrier substrate having a top surface and a back surface, a plurality of first connecting points is disposed on the top surface and a plurality of second connecting points corresponding to the plurality of first connecting points is disposed on the back surface of the carrier substrate; attaching a first die on the top surface of the carrier substrate, the active surface is disposed upward and the back surface of the first die is attached on the carrier substrate; providing a second die having a top surface and a back surface, and a cavity structure is disposed on the top surface of the second die; attaching the second die on said active surface of the first die, the top surface of the second die is downward and attached on the active surface of said first die so as to the cavity structure is an inverse U-type which is disposed between the active surface of the first die and the top surface of the second die; performing a wire bonding process to form a plurality of conductive wires to electrically connect the plurality of pads on the active surface of the first die with the plurality of first connecting points on the top surface of the carrier substrate; performing a molding process to form a polymer material to encapsulate the first die, the second die, the plurality of conductive wires and the top surface of the carrier substrate to form a package body; and forming a plurality of connecting components on the back surface of the carrier substrate and is electrically connected the plurality of connecting points.

According to the packaging method, the present invention also provides a semiconductor package device with a cavity structure, which includes: a carrier substrate having a top surface and a back surface, and a plurality of first connecting points is disposed on the top surface and a plurality of second connecting points corresponding to the plurality of first connecting points is disposed on the back surface of the carrier substrate; the first die having an active surface and a back surface, and a plurality of pads is disposed on the active surface, the active surface of the first die is disposed upward and the back surface of the first die is attached on the top surface of the carrier substrate; the second die having a top surface and a back surface, and a cavity structure is disposed on the top surface of the second die, the top surface of the second die is flipped and attached on the active surface of the first die, so as to the cavity structure is an inverse U-type which is disposed on the active surface of the first die and the top surface of the second die; a plurality of conductive wires is electrically connected the plurality of pads on the active surface of the first die with the plurality of first connecting points on the carrier substrate; a package body encapsulated the first die, the second chop, the plurality of conductive wires, and the portions of the top surface of the carrier substrate; and a plurality of connecting components is disposed on the back surface of the carrier substrate and is electrically connected the plurality of second connecting points.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention will now be described more fully hereinafter with reference to the accompanying drawings, in which preferred embodiments are shown. The objective of the present invention is to provide a method for packaging the semiconductor package device. In the following, the well-known knowledge regarding the of the invention such as the formation of die and the process for forming package structure would not be described in detail to prevent from arising unnecessary interpretations. However, this invention will be embodied in many different forms and should not be construed as limited to the embodiments set forth herein.

Figure 1:
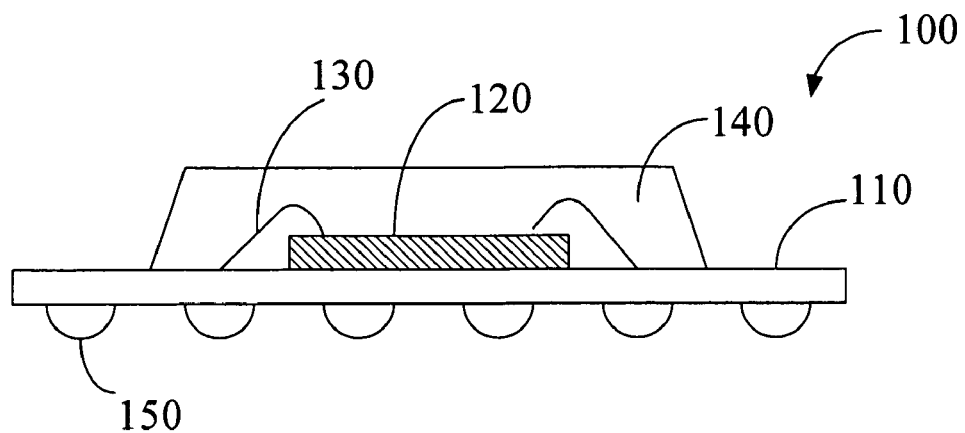
FIG. 1 is a cross-sectional view of the ball grid array package device according to the conventional prior art.
Figure 2:
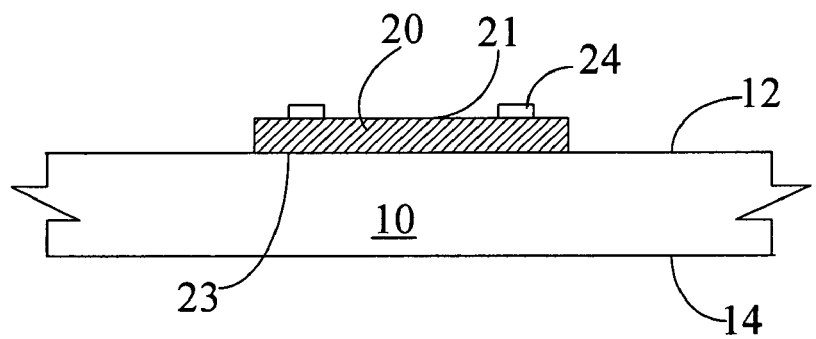
FIG. 2 is a cross-sectional view of the carrier substrate having a die thereon according to the present invention disclosed herein.

Please refer to FIG. 2, a carrier substrate 10 is provided which includes a top surface 12 and a back surface 14. A plurality of first connecting points (not shown) is disposed on top surface 12, and a plurality of second connecting points (not shown) corresponding to the plurality of first connecting points is disposed on the back surface 14 of the carrier substrate 10. The plurality of first connecting points is electrically connected the plurality of second connecting points. The carrier substrate 10 is a printed circuit board or a flexible printed circuit board. In this embodiment of the present invention, how to form the first connecting points and the second connecting points in the carrier substrate 10 is the well-known technologies, thus, it is not should be described in detail herein.

Then, a wafer (not shown) is provided which includes a top surface (not shown) and a back surface (not shown), and a plurality of first die 20 is disposed thereon. Next, the cutting-off tools (not shown) is provided to cut the wafer according to the sawing line (not shown) on the wafer to obtain the plurality of first die 20. In this embodiment, each of the first dies 20 includes an active surface 21 and a back surface 23, and a plurality of pads 24 is disposed on the active surface 21 of each of the first dies 20. Next, the active surface 22 of each of first the dies 20 is disposed upward and the back surface 23 is attached on the top surface 12 of the carrier substrate 10. In this embodiment, an adhesive layer (not shown) is further formed between the back surface 23 of each of the dies 20 and the top surface 12 of the carrier substrate 10 to fix each of the first dies 20 on the top surface 12 of the carrier substrate 10. In this embodiment of the present invention, first die 20 can be an Application-specific integrated circuit (ASIC).

Figure 3:
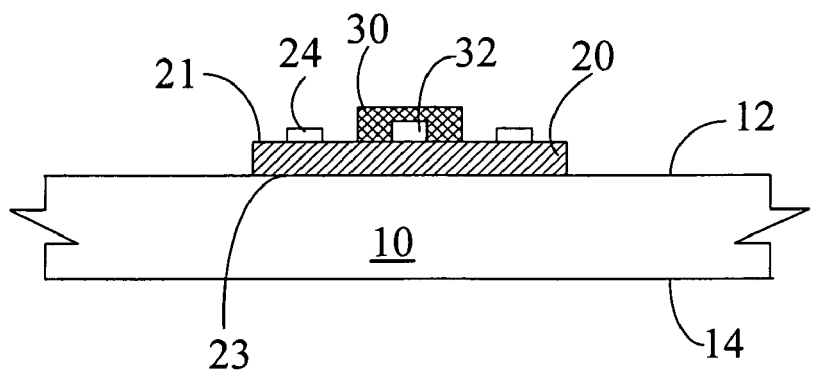
FIG. 3 is a cross-sectional view of another die that is attached on the active surface of the die on the carrier substrate according to the present invention disclosed herein.

Please referring to FIG. 3, a high sensitive electronic material is disposed on the first die 20. In order to obtain the good electronic performance and to avoid the epoxy resin contacting directly with the first die 20 with high sensitive electronic material, another second die 30 with cavity structure as a cap is. disposed on the active surface 21 of the first die 20 so as to merely encapsulate over the high sensitive electronic material on the active surface 21 of the first die 20, and the second die 30 does not encapsulate over the plurality of pads 24 on the active surface 21 of the first die 20. Thus, the cavity structure 32 is an inverse U-type to dispose between the first die 20 and the second die 30. Thus, the cavity structure 32 can isolate the first die 20 (Application-specific integrated circuit) away from the package material (now shown) to decrease the decay of the signal conduction from the package device. In this embodiment, the forming method of the cavity structure 32 on the top surface 12 of the second die 30 includes: providing the second die 30; and performing a chemical etching or physical cutting to form the cavity structure 32 on the top surface (not shown) of the second die 30, in which the second die 30 is a glass. In addition, an adhesive layer (not shown) is further disposed between the top surface (not shown) of the second die 30 and the active surface 21 of the first die 20 to fix the second die 30 on the active surface 21 of the first die 20.

Figure 4:
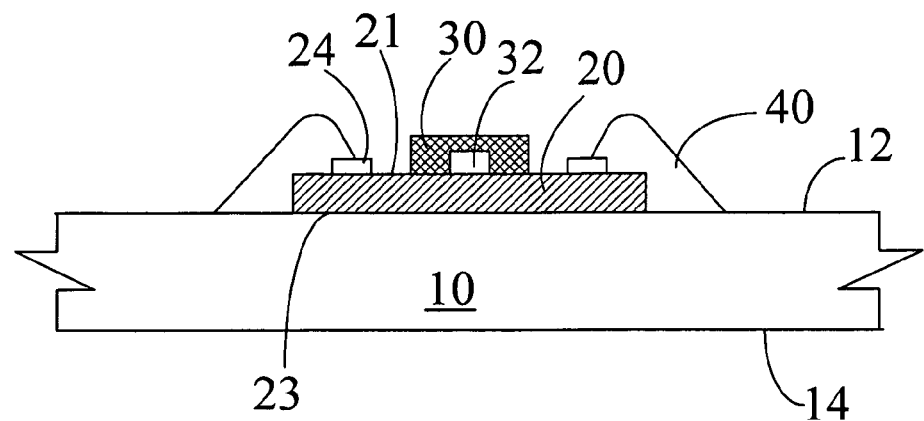
FIG. 4 is a cross-sectional view of the plurality of conductive wires that is electrically connected the die with the carrier substrate according to the present invention disclosed herein.

Next, referring to FIG. 4, which shows a cross-sectional view of the die that is electrically connected the carrier substrate via the plurality of conductive wires. In FIG. 4, the plurality of conductive wires 40 is formed on the plurality of pads 24 on the active surface 21 of the first die 20 by wire bonding process, and is electrically connected the plurality of first connecting points (not shown) on top surface 12 of the carrier substrate 10.

Figure 5:
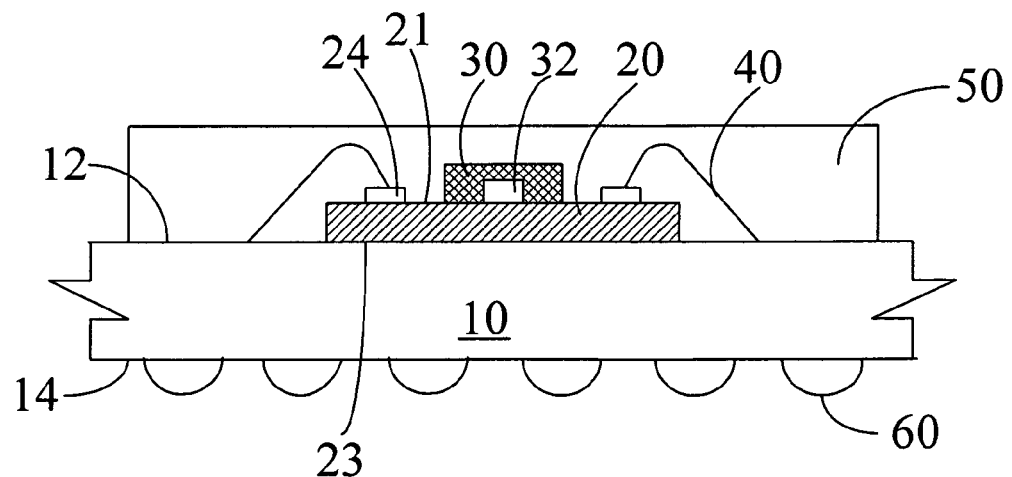
FIG. 5 is a cross-sectional view of a package body to encapsulate the structure of FIG. 4 and a plurality of connecting components is formed on the back surface of the structure of FIG. 4 according to the present invention disclosed herein.

Please refer to FIG. 5, shows a cross-sectional view of the package body that is formed to encapsulate the die, the plurality of conductive wires and portions of the top surface of the carrier substrate by molding process. In FIG. 5, a polymer material such as epoxy resin is formed on the first die 20 to encapsulate the first die 20, the second die 30, the plurality of conductive wires 40, and portions of the top surface 12 of the carrier substrate 10 to form a package body 50.

Please also refer to FIG. 5, the plurality of connecting components 60 is disposed on the back surface 14 of the carrier substrate 10, and is electrically connected the second plurality of connecting points (not shown) on the back surface 14 of the carrier substrate 10. In this embodiment, the plurality of connecting components 60 is solder ball.

According to above discussions, the second die 30 as the cap structure disposed in the Application-specific integrated circuit (ASIC) is a commonly technology in present package manufacture. This die stacked structure is similar to the system in package (SIP) structure. The plurality of conductive wires, the package body and the ball mounting is serially performed after forming the second die 30 for finishing the package process. It means that the semiconductor package device with a cavity structure of the preset invention with a high quality and the packaging method is to be implemented. Thus, according to this packaging method, the semiconductor package device can maintain the characteristic of the millimeter wave, and the package cost cal also decreased. Simply, the circuit with the millimeter wave can be protected by the package device with the cavity structure to prevent the signal from the interference, such that the package device can provide with good reliability.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for packaging a semiconductor package device with a cavity structure, comprising:
providing a first die having an active surface and a back surface and a plurality of pads disposed on said active surface;
providing a carrier substrate having a top surface and a back surface;
attaching said first die on said carrier substrate, said active surface of said first die being disposed upward and said back surface of said first die being attached on said top surface of said carrier substrate;
providing a second die having a top surface and a back surface, and a cavity structure being disposed on said top surface of said second die;

attaching said second die on said active surface, said top surface of said second die being downward and attached on said active surface of said first die so as to said cavity structure being an inverse U-type which being disposed between said active surface of said first die and said top surface of said second die;

performing a wire bonding process to form a plurality of conductive wires to electrically connect said plurality of pads on said active surface of said first die with said top surface of said carrier substrate;

performing a molding process to form a polymer material to encapsulate said first die, said second die, said plurality of conductive wires and said top surface of said carrier substrate to form a package body; and forming a plurality of connecting components on said back surface of said carrier surface and being electrically connected said back surface of said carrier surface.

2. The packaging method according to claim 1, wherein said carrier substrate comprises a printed circuit board.

3. The packaging method according to claim 1, wherein said carrier substrate comprises a flexible printed circuit board.

4. The packaging method according to claim 1, further comprising forming an adhesive layer between said top surface of said carrier substrate and said back surface of said first die.

5. The packaging method according to claim 1, further comprising forming an adhesive layer between said top surface of said second die and said active surface of said first die.

6. The packaging method according to claim 1, wherein the method for forming said cavity structure comprises chemical etching process.

7. The packaging method according to claim 1, wherein the method for forming said cavity structure comprises physical cutting process.

8. The packaging method according to claim 1, wherein said first die is an application-specific integrated circuit (ASIC).

9. The packaging method according to claim 1, wherein the material of said polymer material comprises epoxy resin.

10. The packaging method according to claim 1, wherein said plurality of connecting components comprises solder ball.

11. A semiconductor package device with a cavity structure, comprising:

a carrier substrate having a top surface and a back surface;

a first die having an active surface and a back surface and a plurality of pads disposed on said active surface, said active surface of first die being disposed upward and said back surface of said first die being attached on said top surface of said carrier substrate;

a second die having a top surface and a back surface, a cavity structure being disposed on said top surface of said second die, said top surface of said second die being downward and attached on said active surface of said first die, so that said cavity structure being an inverse U-type which being disposed between said active surface of said first die and said top surface of said second die;

a plurality of conductive wires being electrically connected said plurality of pads on said active surface of said first die with said carrier substrate;

a package body encapsulating said first die, said second die, said plurality of conductive wires, and portions of said top surface of said carrier substrate; and a plurality of connecting components being disposed on said back surface of said carrier substrate and being electrically connected said back surface of said carrier substrate.

12. The semiconductor package device according to claim 11, wherein said carrier substrate comprises a printed circuit board.

13. The semiconductor package device according to claim 11, wherein said carrier substrate comprises a flexible printed circuit board.

14. The semiconductor package device according to claim 11, further comprising forming an adhesive layer between said top surface of said carrier substrate and said back surface of said first die.

15. The semiconductor package device according to claim 11, further comprising an adhesive layer being disposed between said top surface of said second die and said active surface of said first die.

16. The semiconductor package device according to claim 11, wherein said first die is an application-specific integrated circuit (ASIC).

17. The semiconductor package device according to claim 11, wherein the material of package body comprises epoxy resin.

18. The semiconductor package device according to claim 11, wherein said plurality of connecting components comprises solder ball.

* * * * *